United States Patent [19]

Kano

[11] Patent Number: 5,094,628
[45] Date of Patent: Mar. 10, 1992

[54] SOCKET FOR LIGHT EMITTING DIODE

[75] Inventor: Toshiji Kano, Tokyo, Japan

[73] Assignee: Hirose Electric Co., Ltd., Tokyo, Japan

[21] Appl. No.: 598,152

[22] Filed: Oct. 16, 1990

[30] Foreign Application Priority Data

Oct. 16, 1989 [JP] Japan .................. 1-119692[U]

[51] Int. Cl.⁵ .......................................... H01R 13/66
[52] U.S. Cl. ...................................... 439/620; 362/800
[58] Field of Search ................ 439/620; 362/226, 800

[56] References Cited

U.S. PATENT DOCUMENTS

| | | | |
|---|---|---|---|
| 4,471,414 | 9/1984 | Savage | 362/226 |
| 4,580,859 | 4/1986 | Frano et al. | 339/91 R |
| 4,667,270 | 5/1987 | Yagi | 361/380 |
| 4,727,648 | 3/1988 | Savage, Jr. | 29/839 |
| 4,837,927 | 6/1989 | Savage, Jr. | 29/839 |

FOREIGN PATENT DOCUMENTS

2139340 11/1984 United Kingdom ................ 362/800

Primary Examiner—Eugene F. Desmond
Attorney, Agent, or Firm—Kanesaka & Takeuchi

[57] ABSTRACT

A socket for a light emitting diode display which includes a case (1); a pair of contact terminals (2, 3) provided within the case and each having a contact portion for contact with a connecton terminal of a mating connector and a resistor contact portion; a pair of lead terminals (4, 5) provided within the case and each having a lead contact portion and a resistor contact portion; and a pair of resistors (6, 7) provided within the case so that each resistors is connected between a resistor contact portion of one of the contact terminal and a resistor contact portion of one of the lead terminal.

1 Claim, 8 Drawing Sheets

SOCKET FOR LIGHT EMITTING DIODE

BACKGROUND OF THE INVENTION

1. Field of the Invention

The present invention relates to sockets for light emitting diodes useful as display lights.

2. Description of the Prior Art

Conventionally, the light emitting diodes and the current limiting resistors of displays or indicators have been soldered on flexible printed circuit boards having a thickness of about 100 microns instead of rigid printed circuit boards having a thickness of about 1.6 mm because they are mounted on vehicles, more especially on instrument panels or torque converter indicators.

However, since the light emitting diodes and the current limiting resistors must be soldered separately, a large amount of work has been required

SUMMARY OF THE INVENTION

Accordingly, it is an object of the invention to provide a socket which is able to eliminate the above soldering work, thereby making the manufacture easier It is another object of the invention to provide a socket which is able to permit the use of a pair of resistors; one being used as a current limiting resistor and the other as a fine tuning resistor.

It is still another object of the invention to provide a socket which has similarly formed contact terminals and lead terminals, thereby making the terminal manufacture easier and the display manufacturing costs lower.

According to the invention there is provided a socket which includes a case; a pair of contact terminals provided within the case and each having a contact portion for contact with a connection terminal of a mating connector and a resistor contact portion; a pair of lead terminals provided within the case and each having a lead contact portion and a resistor contact portion; and a pair of resistors provided within the case so that each resistor is connected between a resistor contact portion of one of the contact terminal and a resistor contact portion of one of the lead terminal.

According to the invention, the current limiting resistor is embedded within the case, thereby eliminating the soldering operation between the light emitting diode and the current limiting resistor and making the display manufacture easier. The two resistors are used as a current limiting resistor and a fine adjustment resistor, respectively. The contact terminals and the lead terminals have same structures, respectively, thereby making the terminal manufacture simpler and the display manufacturing costs lower.

Other objects, features, and advantages of the invention will be apparent from the following description as taken in conjunction with the accompanying drawings.

DESCRIPTION OF THE PREFERRED EMBODIMENT

Figure 1:
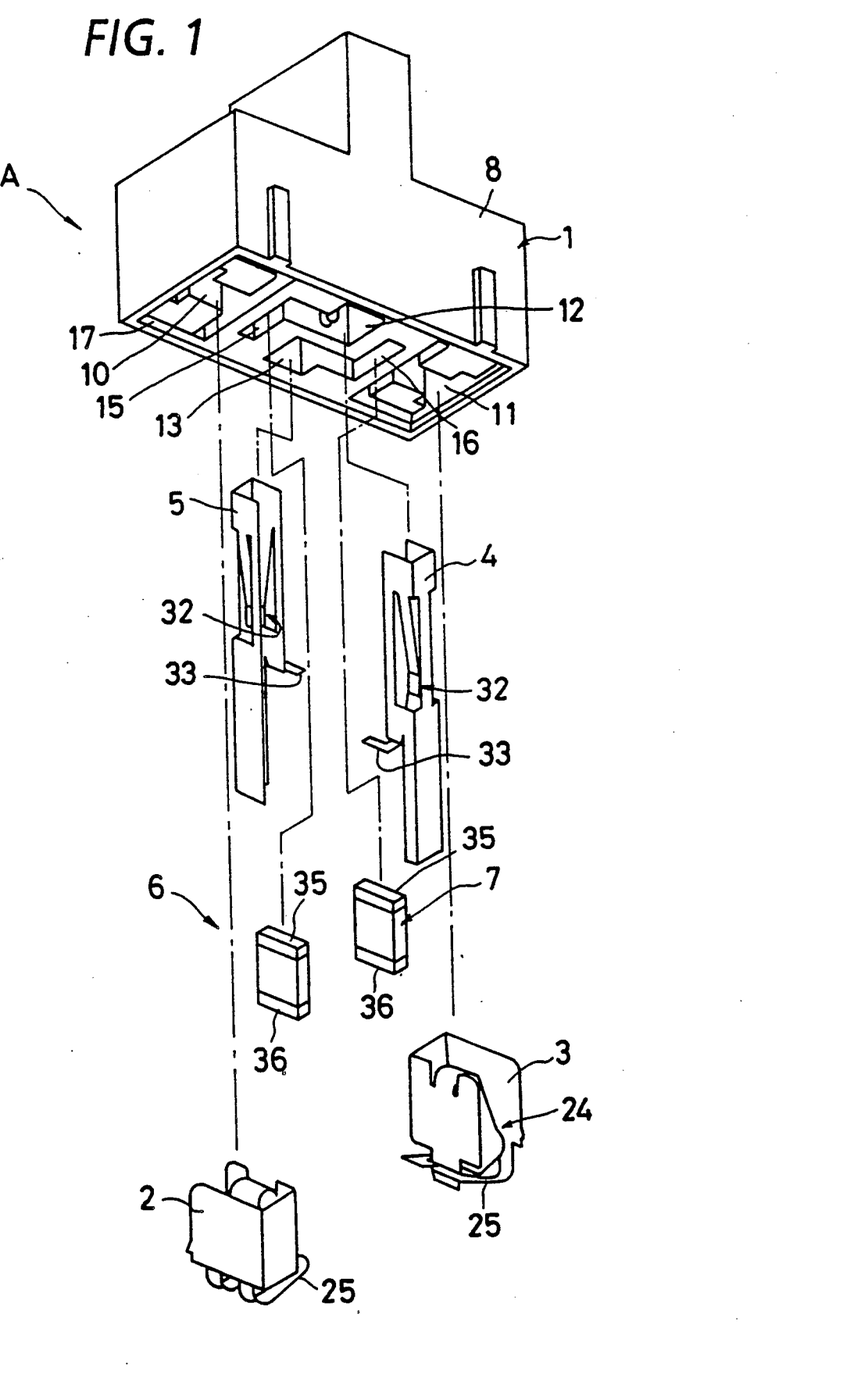
FIG. 1 is an exploded, perspective view of a socket according to an embodiment of the invention.
Figure 2:
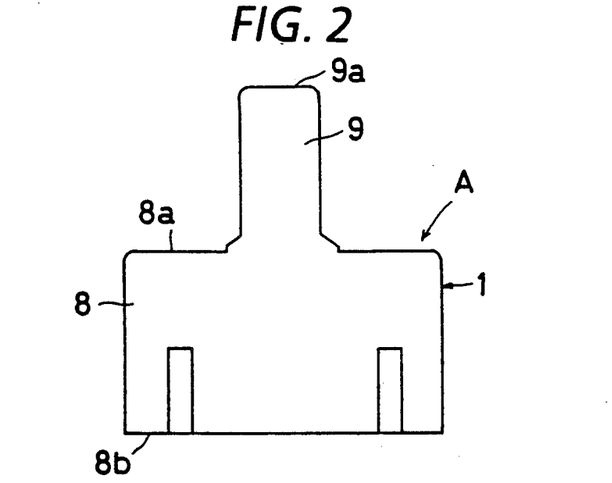
FIG. 2 is an elevational front view of the socket.
Figure 3:
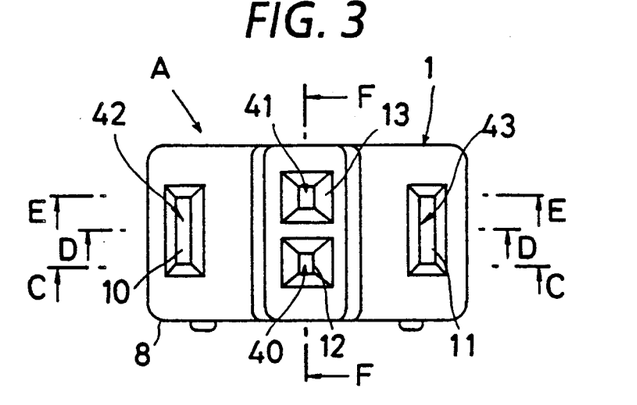
FIG. 3 is a top plan view of the socket.
Figure 4:
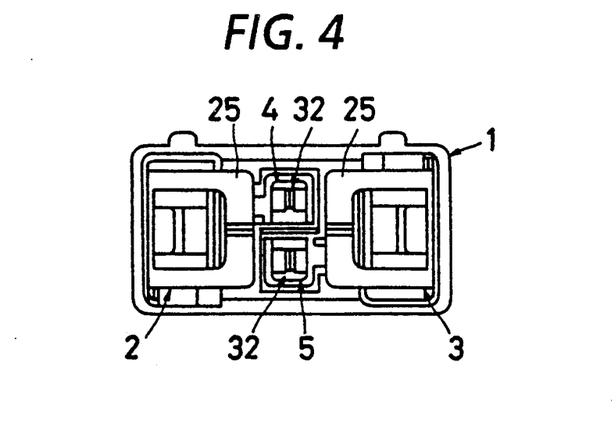
FIG. 4 is a bottom plan view of the socket.

FIG. 1 shows a socket A in an exploded perspective form according to an embodiment of the invention. The socket A consists of a case 1 made of an insulating material; a pair of contact terminals 2 and 3; a pair of lead terminals 4 and 5; and a pair of resistors 6 and 7.

As FIGS. 9-16 show, the case 1 has a case body 8 with a light emitting diode (LED) holder 9 extending upwardly from the center of a top face 8a. The case body 8 has a recess 17 on the bottom face; a pair of contact terminal apertures 10 and 11 extending downwardly from the top face 8a to the recess 17; and a pair of lead terminal apertures 12 and 13 extending downwardly from a top face 9a of the LED holder 9 to the recess 17. A pair of resistor slots 15 and 16 are formed between the contact terminal aperture 10 and the lead terminal aperture 1, and the contact terminal aperture 11 and the lead terminal aperture 13, respectively. The contact terminal apertures 10 and 11 have the same configuration but their orientation are reversed. Similarly, the lead terminal apertures 12 and 13 have the same configuration but their orientation are reversed. The lead terminal apertures 12 and 13 communicate with the resistor slot 15 and 16 via passages 18 and 19, respectively.

As FIGS. 17-21 show, the contact terminals 2 and 3 each have a terminal body 20 formed by bending a sheet metal into the C-shaped cross section. A contact element 22 extends downwardly within the terminal body 20 from the top edge of a side face 21. The free end portion of the contact element 22 is curved to form a bent portion 22a which is in contact with the other side face 23 forming a contact portion 24. A resistor contact 25 extends toward and beyond the side face 21 from the bottom edge of the side face 23 and has a contact projection 26 at the free end portion.

As FIGS. 22-25 show, the lead terminals 4 and 5 each have an elongated body 27 formed by bending a sheet metal into the C-shaped cross section. A pair of contact elements 30 and 31 extends downwardly and inwardly from the top portion of side faces 28 and 29 to form a lead contact portion 32. A resistor contact 33 extends laterally from the side face 28 and has a contact projection 34 at the free end portion.

As FIG. 1 shows, each of the resistors 6 and 7 has a pair of contact portions 35 and 36 at opposite ends.

Figure 5:
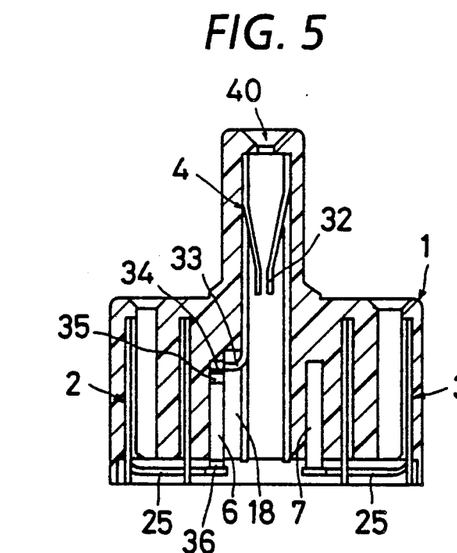
FIG. 5 is a sectional view taken along the line C—C of FIG. 3.
Figure 6:
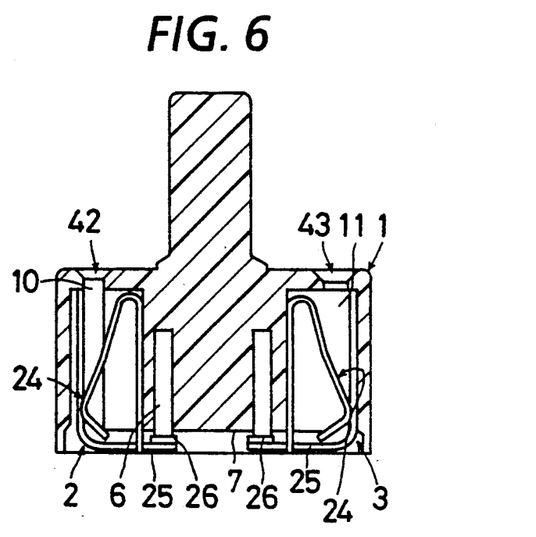
FIG. 6 is a sectional view taken along the line D—D of FIG. 3.
Figure 7:
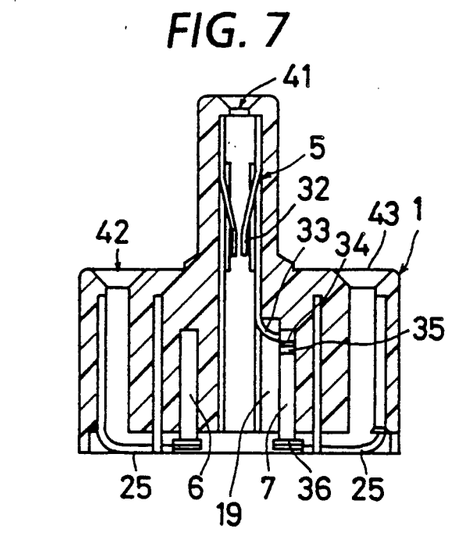
FIG. 7 is a sectional view taken along the line E—E of FIG. 3.
Figure 8:
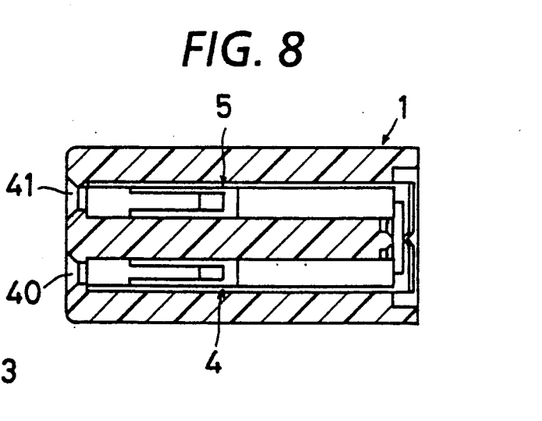
FIG. 8 is a sectional view taken along the line F—F of FIG. 3.
Figure 9:
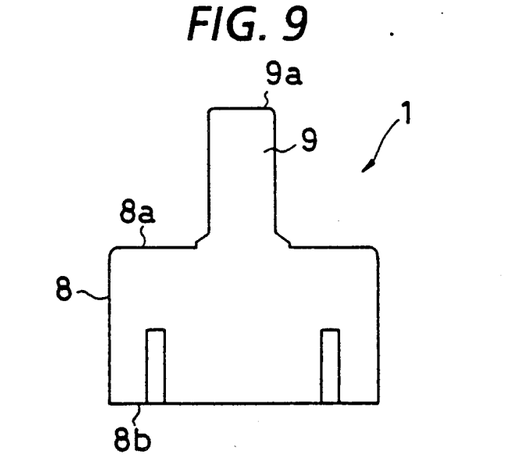
FIG. 9 is an elevational front view of a case of the socket.
Figure 10:
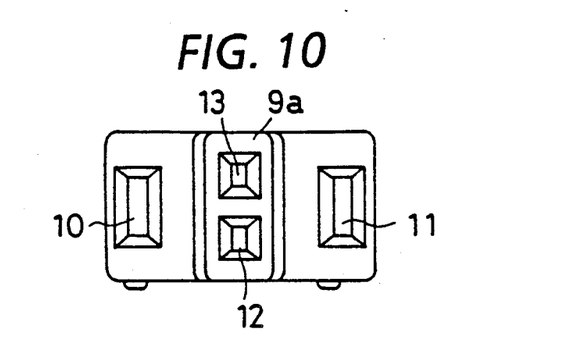
FIG. 10 is a top plan view of the case.
Figure 11:
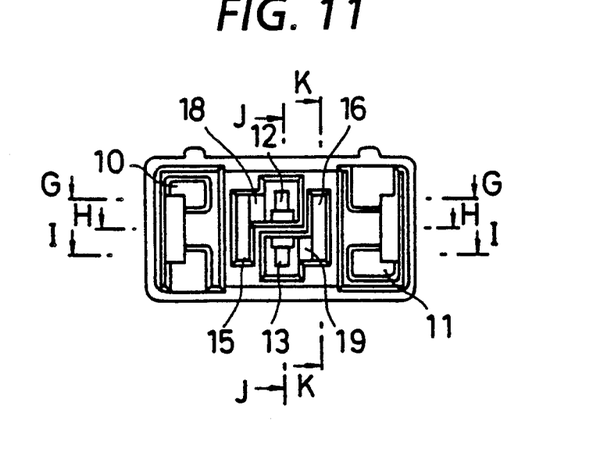
FIG. 11 is a bottom plan view of the case.
Figure 12:
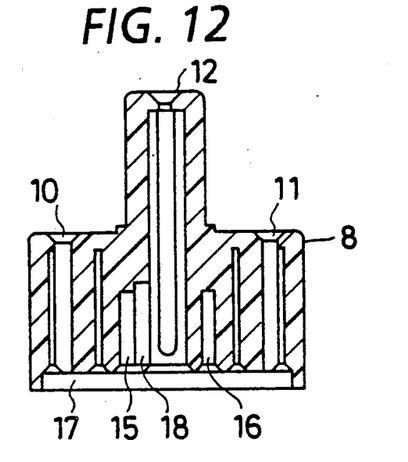
FIG. 12 is a sectional view as taken along the line G—G of FIG. 11.
Figure 13:
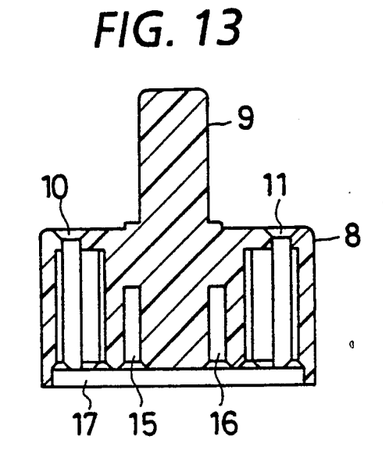
FIG. 13 is a sectional view taken along the line H—H of FIG. 11.
Figure 14:
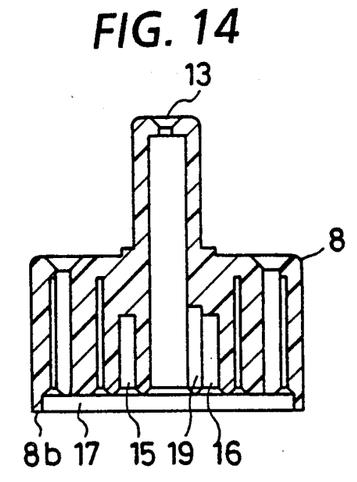
FIG. 14 is a sectional view taken along the line I—I of FIG. 11.
Figure 15:
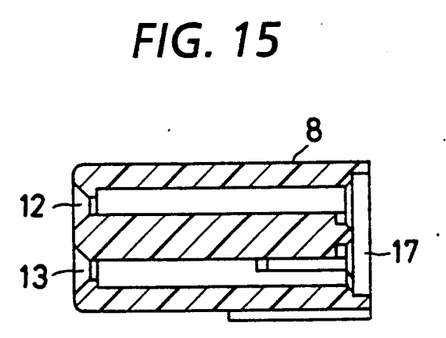
FIG. 15 is a sectional view taken along the line J—J of FIG. 11.
Figure 16:
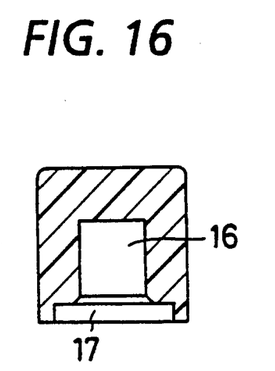
FIG. 16 is a sectional view taken along the line K—K of FIG. 11.
Figure 17:
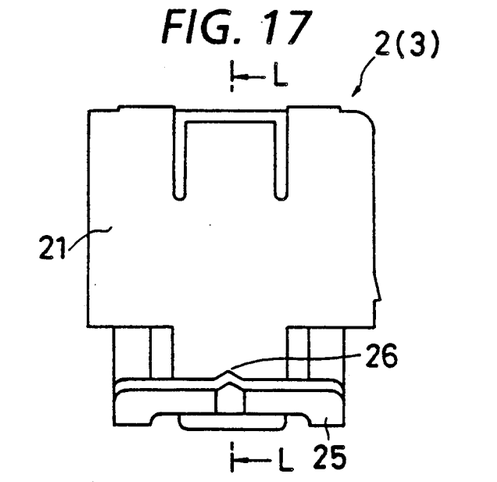
FIG. 17 is an elevational front view of a contact
Figure 18:
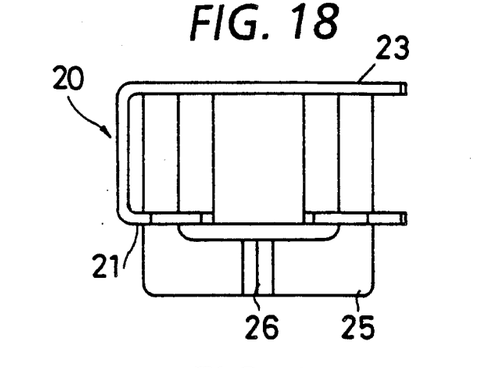
FIG. 18 is a top plan view of the contact
Figure 19:
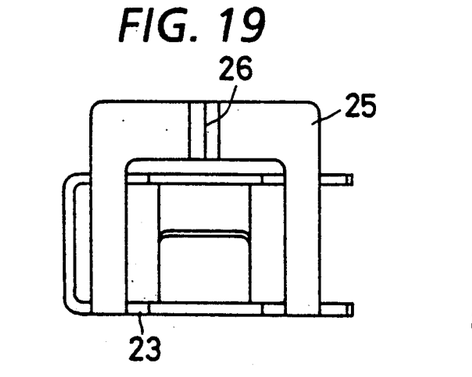
FIG. 19 is a bottom plan view of the contact
Figure 20:
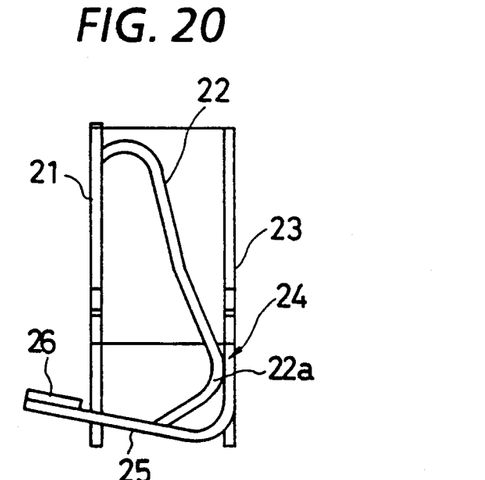
FIG. 20 is a right-hand side view of the contact
Figure 21:
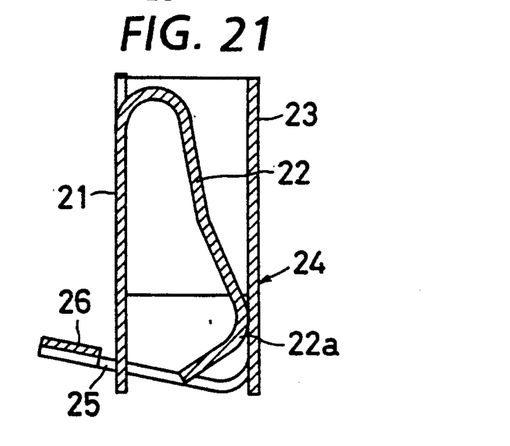
FIG. 21 is a sectional view as taken along the line of L—L of FIG. 17.
Figure 22:
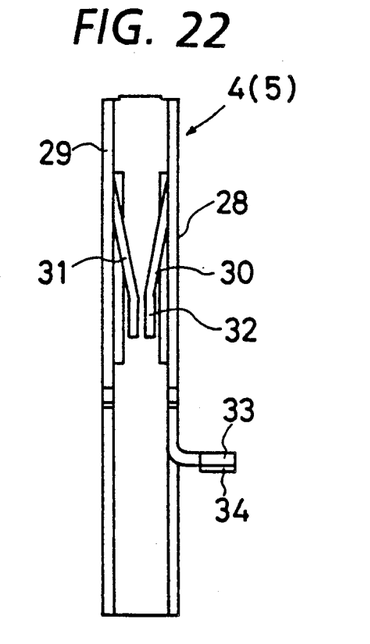
FIG. 22 is an elevational front view of a lead
Figure 23:
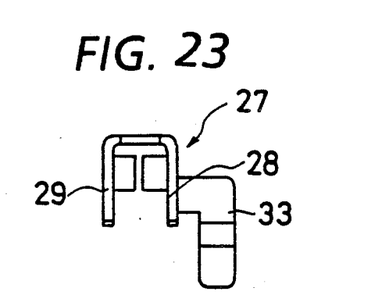
FIG. 23 is a top plan view of the lead terminal.
Figure 24:
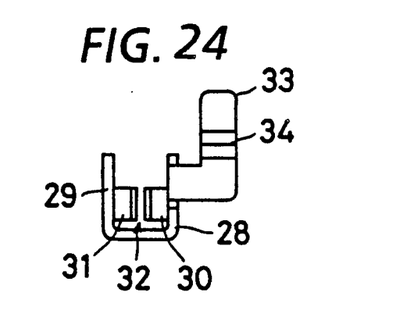
FIG. 24 is a bottom plan view of the lead
Figure 25:
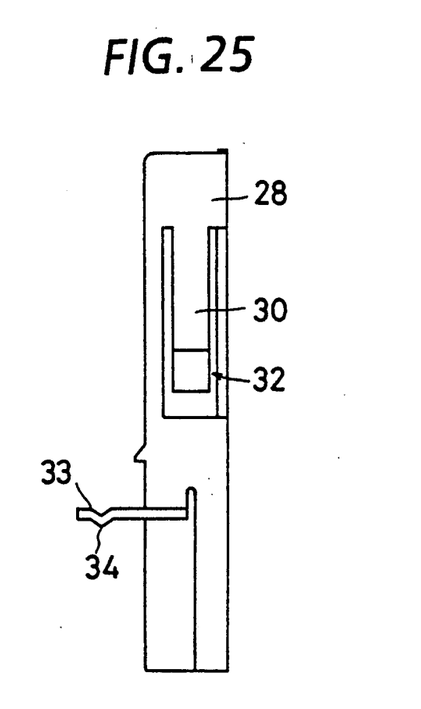
FIG. 25 is a right-hand side view of the lead

As FIG. 5 and 7 shows, the lead terminals 4 and 5 are inserted into the lead terminal apertures 12 and 13, respectively, from the side of the recess 17 to not only form lead receptor 40 and 41 but also bring the resistor contacts 33 into the upper portions of the passages 18 and 19. Then, the resistors 6 and 7 are inserted into the slots 15 and 16 from the side of the recess 17 to bring the contact portions 35 into contact with the contact projections 34 of the resistor contacts 33. Then, the contact terminals 2 and 3 are inserted into the contact terminal apertures 10 and 11 from the side of the recess 17 to not only form the contact terminal receptors 42 and 43 but also bring the resistor contact portions 25 of the contact terminals 2 and 3 into contact with the contact portions 36 of the resistors 6 and 7, respectively, to form a socket.

Figures 26, 27:
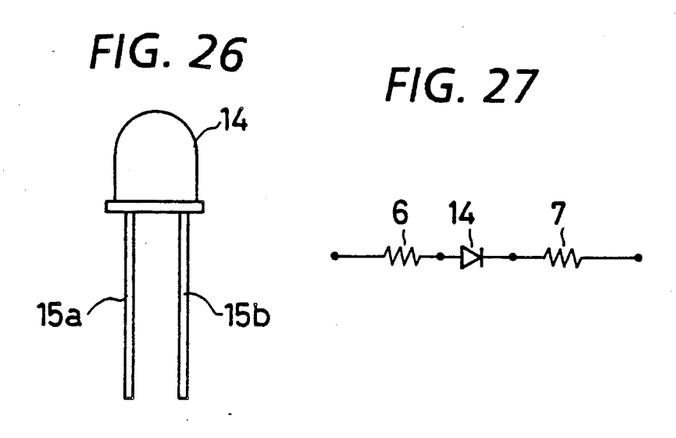
FIG. 26 is an elevational front view of a light emitting diode.
FIG. 27 is a lighting circuit.

FIG. 26 shows a light emitting diode 14 which has a pair of leads 15a and 15b.

Figure 28:
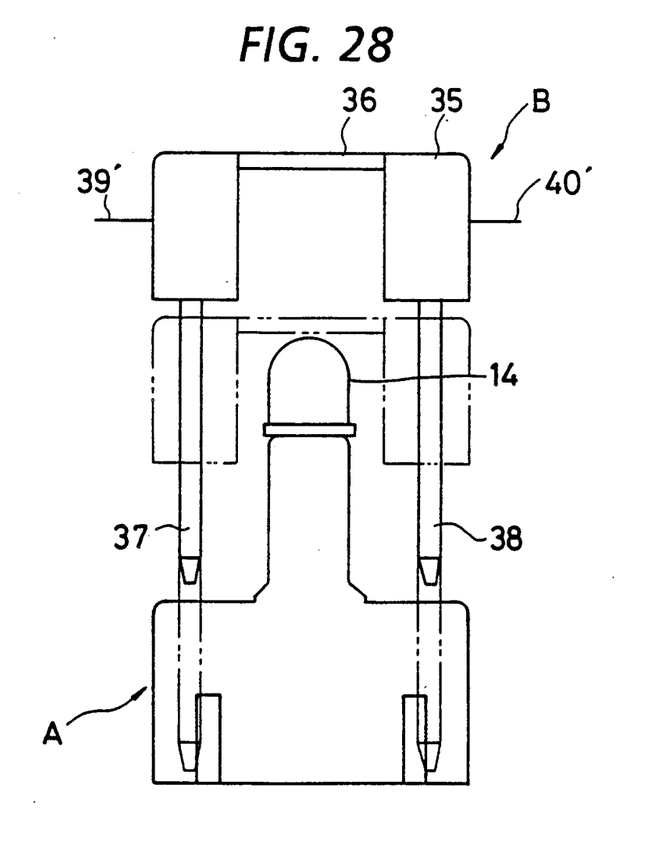
FIG. 28 is an elevational front view of the socket and a mating connector.

As FIG. 28 shows, a mating connector B has a connector body 35 which has a central clear window portion 36. A pair of connection terminals 37 and 38 are provided on opposite sides of the clear window portion 36. A pair of leads 39 and 40 are provided on the connector body 35 and connected to the respective connection terminals 37 and 38.

The light emitting diode 14 is mounted on the socket A as follows: The leads 15a and 15b of the LED 14 are inserted into the lead receptors 40 and 41 of the connector A so that they come into contact with the lead contact portions 32 of the lead terminal 4 and 5, respectively. The lighting circuit of the LED 14 mounted on the socket A is shown in FIG. 27. The contact portions 35 and 36 of the resistor 6 are connected between the contact projection 34 of the lead terminal 4 and the contact project 26 of the contact terminal 2. The leads 15a and 15b of the LED 14 are connected to the lead contact portions 32 of the lead terminals 4 and 5, respectively. Similarly, the contact portions 35 and 36 of the resistor 7 are connected between the contact projection 34 of the lead terminal 5 and the contact projection 26 of the contact terminal 3. One of the resistors 6 and 7 is used as a current limiting resistor while the other is used as a fine adjustment resistor.

The socket A with the LED 14 is mounted on the mating connector B as follows: As FIG. 28 shows, the connection terminals 37 and 38 of the connector B are inserted into the connector terminals receptors 42 and 43 so that they come into contact with the terminal contact portions 24 of the contact terminals 2 and 3, respectively. Consequently, current flows from the connection terminal 37 of the connector B to the contact terminal 2 to turn on the LED 14. The light from the LED 14 passes through the clear portion 36 for making a display or indicator.

As been described above, with the socket structure according to the invention, it is possible to embed in the case the resistor for limiting current to the light emitting diode, thereby eliminating the soldering operation and facilitating the display manufacture. Also, it is possible to use two resistors; one as a current limiting resistor and the other as a fine adjustment resistor. The contact and lead terminals have the same structure, respectively, thereby simplifying the terminal manufacture and reducing the display manufacture costs.

I claim:

1. A detachable socket for a two-lead electrical device, comprising:

a case of an insulating material;

a pair of identical contact terminals provided within said case and each having a contact portion for contact with a connection terminal of a mating connector and a resistor contact portion;

a pair of identical lead terminals provided within said case and each having a lead contact portion and a resistor contact portion;

a pair of resistors provided within said case so that each resistor is connected between a resistor contact portion of one of said contact terminal and a resistor contact portion of one of said lead terminal; and said resistors are a current limiting resistor and a fine tuning resistor, respectively.

* * * * *